United States Patent
Bae et al.

(10) Patent No.: US 8,242,821 B2
(45) Date of Patent: Aug. 14, 2012

(54) DELAY-LOCKED LOOP FOR CORRECTING DUTY RATIO OF INPUT CLOCK SIGNAL AND OUTPUT CLOCK SIGNAL AND ELECTRONIC DEVICE INCLUDING THE SAME

(75) Inventors: Chang-Hyun Bae, Hwasung-si (KR); Jun Bae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 166 days.

(21) Appl. No.: 12/793,849

(22) Filed: Jun. 4, 2010

(65) Prior Publication Data
US 2010/0321076 A1 Dec. 23, 2010

(30) Foreign Application Priority Data
Jun. 17, 2009 (KR) ................ 10-2009-0054007

(51) Int. Cl.
*H03L 7/06* (2006.01)
(52) U.S. Cl. ............................. 327/158; 327/149
(58) Field of Classification Search .............. 327/149, 327/156
See application file for complete search history.

(56) References Cited

U.S. PATENT DOCUMENTS

| | | | |
|---|---|---|---|
| 5,614,855 A | 3/1997 | Lee et al. | |
| 7,020,228 B2* | 3/2006 | Miyano | 375/376 |
| 7,598,783 B2* | 10/2009 | Shin et al. | 327/158 |
| 7,821,310 B2* | 10/2010 | Yun et al. | 327/158 |
| 7,902,899 B2* | 3/2011 | Hong | 327/294 |
| 7,928,783 B2* | 4/2011 | Yun et al. | 327/158 |
| 7,990,194 B2* | 8/2011 | Shim | 327/158 |
| 2007/0176657 A1* | 8/2007 | Byun et al. | 327/158 |
| 2008/0174350 A1* | 7/2008 | Shin et al. | 327/158 |
| 2010/0109725 A1* | 5/2010 | Yun et al. | 327/158 |
| 2010/0289542 A1* | 11/2010 | Yun et al. | 327/158 |
| 2011/0102039 A1* | 5/2011 | Shin | 327/175 |
| 2011/0215851 A1* | 9/2011 | Oh et al. | 327/158 |
| 2011/0221496 A1* | 9/2011 | Kim | 327/158 |

FOREIGN PATENT DOCUMENTS

| | | |
|---|---|---|
| JP | 2006-060842 | 3/2006 |
| JP | 2008-182667 | 8/2008 |
| KR | 10-0393317 | 7/2003 |
| KR | 1020070016737 A | 2/2007 |
| KR | 1020080069756 A | 7/2008 |

* cited by examiner

*Primary Examiner* — Lincoln Donovan
*Assistant Examiner* — Adam Houston
(74) *Attorney, Agent, or Firm* — Volentine & Whitt, PLLC

(57) ABSTRACT

A delay-locked loop includes a delay line and a duty correction block. The delay line includes receives an input clock signal and includes a cascade of delay cells for respectively generating a plurality of delayed input clock signals based on the input clock signal. The duty correction block is for correcting a duty ratio of the input clock signal based on a duty ratio of at least one clock signal from among the input clock signal and the plurality of delayed input clock signals in a first duty correction operation in which the duty ratio of the input clock signal is corrected, and correcting a duty ratio of an output clock signal based on the duty ratio of the output clock in a second duty correction operation in which the duty ratio of the output clock signal is corrected.

16 Claims, 9 Drawing Sheets

DELAY-LOCKED LOOP FOR CORRECTING DUTY RATIO OF INPUT CLOCK SIGNAL AND OUTPUT CLOCK SIGNAL AND ELECTRONIC DEVICE INCLUDING THE SAME

CROSS-REFERENCE TO RELATED APPLICATIONS

A claim of priority is made to Korean Patent Application No. 10-2009-0054007, filed on Jun. 17, 2009, in the Korean Intellectual Property Office, the disclosure of which is incorporated herein in its entirety by reference.

BACKGROUND

The inventive concepts disclosed herein generally relate to Delay-Locked Loop (DLL) circuits and to electronic device including the DLL.

A DLL circuit of an electronic system may be utilized to receive an external clock signal (supplied from external the electronic system) and to generate an output clock signal in synchronization with the external clock signal. The output clock signal generated by the DLL circuit may be used as an internal clock signal in the electronic system.

The electronic system may, for example, be a semiconductor memory device. In order to secure a maximum timing margin of a memory device that uses an output clock signal generated by a DLL circuit as an internal clock signal, the duty ratio of the output clock signal should be maintained at a constant level, e.g., 50%.

Generally, a DLL circuit includes a delay line composed of a plurality of delay cells, e.g., a plurality of inverters. If a duty skew occurs in the external clock signal supplied to the DLL circuit, then the duty skew is accumulated while the external clock signal is sequentially supplied to the plurality of delay cells. This can prevent the duty ratio of the output clock signal from being maintained at a constant level. Further, as the operating frequency of the DLL circuit becomes higher, this phenomenon becomes more serious and can cause malfunctioning of the electronic system (or memory device).

SUMMARY

According to an aspect of the inventive concepts, there is provided a delay locked loop. The delay-locked loop may include a delay line and a duty correction block. The delay line includes receives an input clock signal and includes a cascade of delay cells for respectively generating a plurality of delayed input clock signals based on the input clock signal. The duty correction block is for correcting a duty ratio of the input clock signal based on a duty ratio of at least one clock signal from among the input clock signal and the plurality of delayed input clock signals in a first duty correction operation in which the duty ratio of the input clock signal is corrected, and correcting a duty ratio of an output clock signal based on the duty ratio of the output clock in a second duty correction operation in which the duty ratio of the output clock signal is corrected.

According to another aspect of the inventive concept, there is provided a delay-locked loop. The delay-locked loop may comprise a delay line, a first duty correction block, a second duty correction block, and a duty control block. The delay line includes receives an input clock signal and includes a cascade of delay cells for respectively generating a plurality of delayed input clock signals based on the input clock signal. The first duty correction block for correcting a duty ratio of the input clock signal according to a first control signal. The second duty correction block for correcting a duty ratio of an output clock according to a second control signal. The duty control block for generating the first control signal based on a duty ratio of at least one clock signal from among the input clock signal and the plurality of delayed input clock signals in a first duty correction operation in which the duty ratio of the input clock signal is corrected, and generating the second control signal based on the duty ratio of the output clock signal in a second duty correction operation in which the duty ratio of the output clock signal is corrected.

According to another aspect of the inventive concept, there is provided a electronic device. The electronic device uses an output clock signal of a delay-locked loop by a timing signal. The delay-locked loop may comprise a delay line and a duty correction block. The delay line may comprise a cascade of delay cells for receiving an input clock signal and for respectively generating a plurality of delayed input clock signals based on the input clock signal. The duty correction block may execute a first duty correction operation and a second duty correction operation. The first duty correction operation includes correcting a duty ratio of the input clock signal based on a duty ratio of at least one clock signal from among the input clock signal and the plurality of delayed input clock signals. The second duty correction operation includes correcting a duty ratio of the output clock signal based on the duty ratio of the output clock signal.

BRIEF DESCRIPTION OF THE DRAWINGS

Exemplary embodiments of the inventive concepts will be more clearly understood from the following detailed description taken in conjunction with the accompanying drawings, in which.

DETAILED DESCRIPTION OF THE EMBODIMENTS

Figure 1:
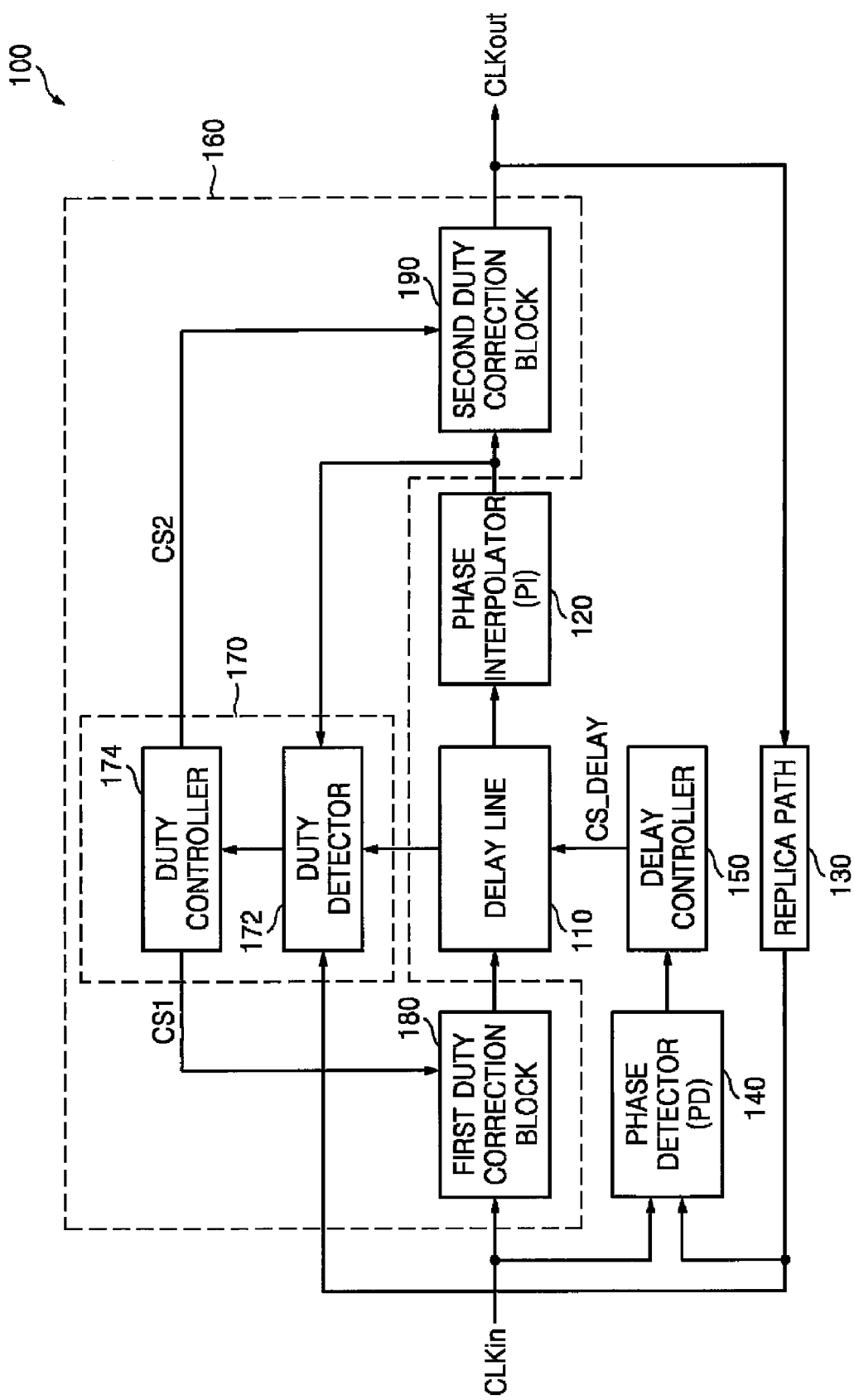
FIG. 1 is a block diagram of a Delay-Locked Loop (DLL) circuit according to an embodiment of the inventive concepts.

The inventive concepts will be described more fully hereinafter with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a Delay-Locked Loop (DLL) 100 according to an embodiment of the inventive concepts. Referring to FIG. 1, the DLL 100 includes a delay line 110, a phase interpolator (PI) 120, a replica path 130, a phase detector 140, a delay controller 150, and a duty correction block 160.

Figure 2:
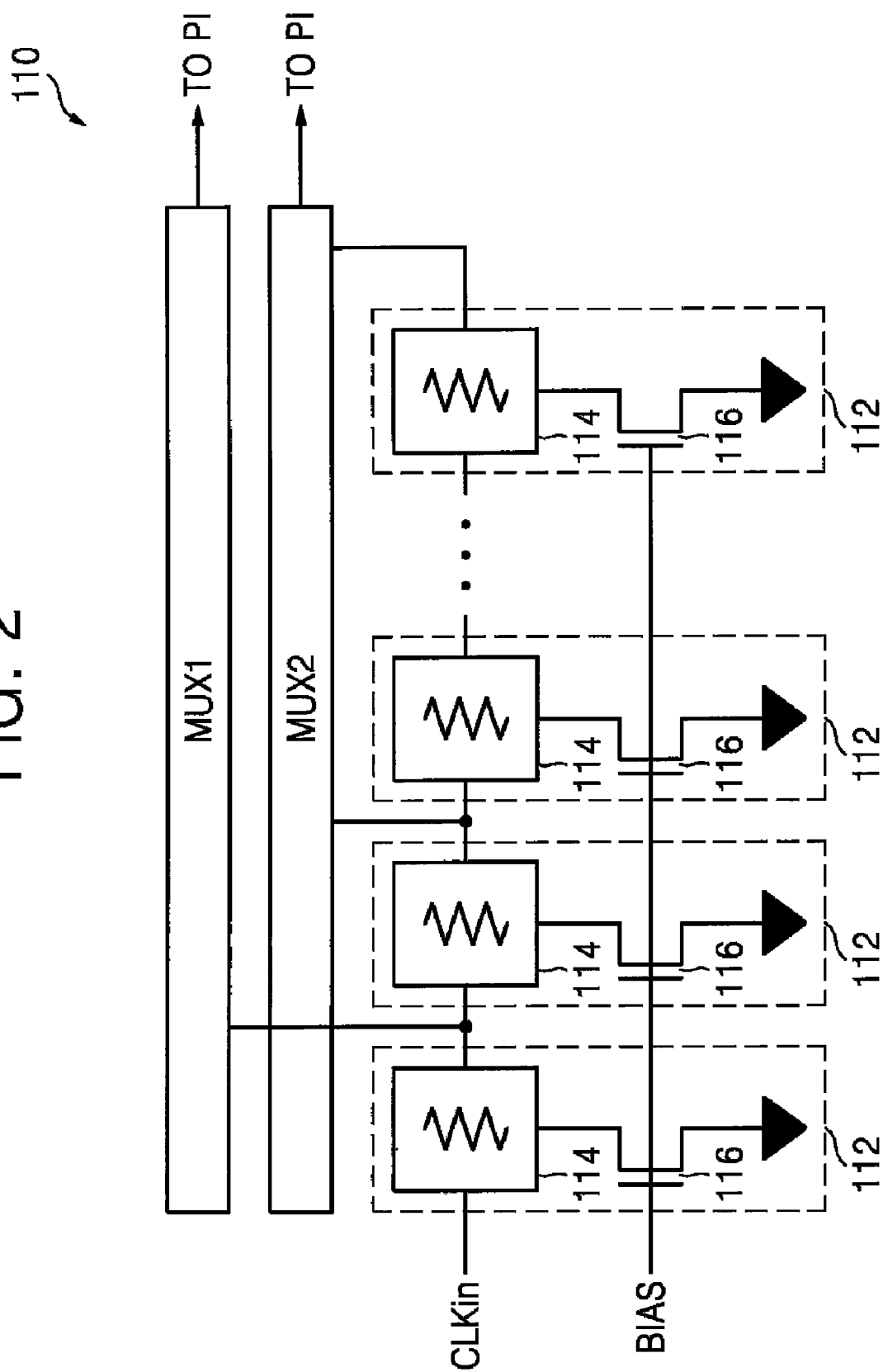
FIG. 2 is a circuit diagram of a delay line included in the DLL circuit of FIG. 1, according to an embodiment of the inventive concepts.

FIG. 2 is a circuit diagram of the delay line 110 included in the DLL 100 of FIG. 1, according to an embodiment of the inventive concepts. Referring to FIGS. 1 and 2, the delay line 110 includes a cascade of delay cells 112 (or delay stages) that respectively generate a plurality of delayed input clock signals by delaying an input clock signal CLKin for a predetermined unit time. In the example of FIG. 1, prior to being input to the delay line 110, the duty ratio of the input clock signal CLKin is first corrected by a first duty correction block 180 of the duty correction block 160.

Each of the cascade of delay cells 112 includes a delay unit 114 that delays the input clock signal CLKin for the predetermined unit time, and a bias unit 114 that is driven by a bias voltage BIAS.

As shown in FIG. 2, the plurality of delayed input clock signals output from the respective delay cells 112 are selectively supplied to the phase interpolator (PI) 120 (FIG. 1) via first and second multiplexers MUX1 and MUX2.

Returning to FIG. 1, the phase interpolator 120 interpolates the plurality of delayed input clock signals received from the first and second multiplexers MUX1 and MUX2 of the delay line 110. The phase interpolator 120 may be driven only when the DLL 100 completes coarse locking and performs fine locking. For example, the phase interpolator 120 may generate a clock signal, the phase of which is between the phases of a pair of corresponding clock signals from among the plurality of delayed input clock signals received from the first and second multiplexers MUX1 and MUX2 of the delay line 110. The generated clock signal may be used for fine locking of the phase of an output clock signal CLKout.

The replica path 130 is a result of modeling a delay in a path, e.g., a buffering path (not shown), along which the output clock CLKout is supplied to an electronic system (not shown) that uses the output clock CLKout as an internal clock signal.

Figure 3:
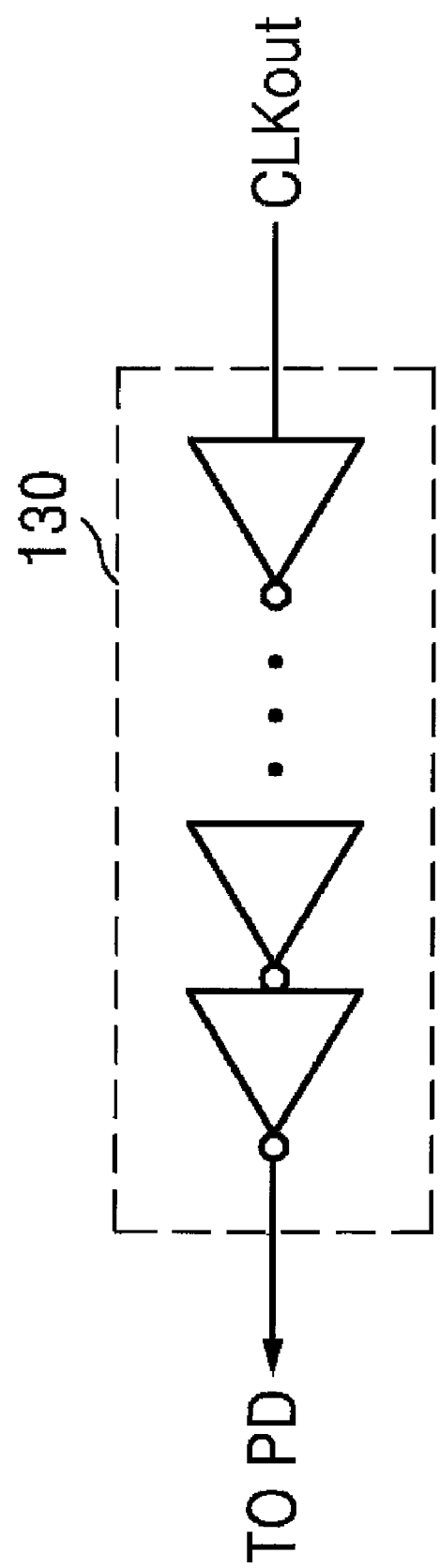
FIG. 3 is a circuit diagram of a replica path included in the DLL circuit of FIG. 1, according to an embodiment of the inventive concepts.

FIG. 3 is a circuit diagram of the replica path 130 included in the DLL 100 of FIG. 1, according to an embodiment of the inventive concepts. Referring to FIG. 3, the replica path 130 may be embodied with a plurality of buffers connected in series to one another. However, the inventive concepts are not limited thereto.

The phase detector 140 detects the difference between the phases of the input clock signal CLKin and the output clock CLKout, and provides the detecting result to the delay controller 150. The delay controller 150 generates a delay control signal CS_DELAY for controlling the operation of the delay line 110, based on the difference between the phases of the input clock signal CLKin and the output clock CLKout. Then, the delay line 110 may delay the input clock signal CLKin according to the delay control signal CS_DELAY.

The duty correction block 160 not only corrects the duty ratio of the output clock CLKout, but also corrects the duty ratio of the input clock signal CLKin to a predetermined level. Hereinafter, an operation of correcting the duty ratio of the input clock signal CLKin by the duty correction block 160 will be referred to as a 'first duty correction operation' and an operation of correcting the duty ratio of the output clock CLKout by the duty correction block 160 will be referred to as a 'second duty correction operation'.

In the first duty correction operation, the duty correction block 160 corrects the duty ratio of the input clock signal CLKin based on the input clock signal CLKin. In addition, the duty correction block 160 may also correct the duty ratio of the input clock signal CLKin based the duty ratio of at least one clock signal from among the result of performing the first duty correction operation and the plurality of delayed input clock signals received from the delay line 110.

Referring to FIG. 1, a signal obtained by delaying the input clock signal CLKin by passing the input clock signal CLKin through the delay line 110, is supplied to a duty detector 172 via the phase interpolator 120. Since the phase interpolator 120 does not operate for fine locking in the first and second duty correction operations, the signal supplied to the duty detector 172 is simply a result of delaying the input clock signal CLKin.

As described above, the DLL 100 may use a plurality of loops in order to perform the first duty correction operation. In this case, at least two loops may be used from among the plurality of loops in order to perform the first duty correction operation. At least two loops related to a path in which the output clock CLKout is generated may be used from among the plurality of loops in order to perform the second duty correction operation.

In the second duty correction operation, the duty correction block 160 corrects the duty ratio of the output clock CLKout based on the duty ratio of the output clock CLKout. Here, the output clock CLKout may be an output clock signal, the duty ratio of which is not corrected and that is output from the phase interpolator 120 or may be an output clock signal, the duty ratio of which is corrected by a second duty correction block 190. However, the output clock signal CLKout may be actually supplied to the duty correction block 160 via the replica path 130.

The duty correction block 160 may complete execution of the first duty correction operation before the DLL 100 starts coarse locking, so that the duty ratio of the input clock signal CLKin may be corrected to a predetermined level before the DLL 100 performs coarse locking, thereby preventing duty distortion from occurring in the output clock signal CLKout caused by duty distortion of the input clock signal CLKin.

The duty correction block 160 may start performing the second duty correction operation before the DLL 100 performs coarse locking, so that for precise locking, the duty ratio of the output clock CLKout may be corrected after the duty ratio of the input clock signal CLKin is corrected and before the DLL 100 performs coarse locking in order to prevent duty distortion of the output clock signal CLKout caused by the delay line 110.

The duty correction block 160 includes a duty control block 170, the first duty correction block 180, and the second duty correction block 190. In the first duty correction operation, the duty control block 170 may generate a first control signal CS1 for correcting the duty ratio of the input clock signal CLKin, based on the duty ratio of at least one clock signal from among the input clock signal CLKin and the plurality of delayed input clock signals. In the second duty correction operation, the duty control block 170 may generate a second control signal CS2 for correcting the duty ratio of the output clock CLKout, based on the duty ratio of the output clock CLKout.

The duty detector 172 may detect the duty ratio of at least one clock signal from among the input clock signal CLKin and the plurality of delayed input clock signals in the first duty correction operation, and may detect the duty ratio of the output clock CLKout in the second duty correction operation. The duty controller 174 may generate the first control signal CS1 based on the detected duty ratio of the at least one clock signal in the first duty correction operation and may generate the second control signal CS2 based on the detected duty ratio of the output clock CLKout in the second duty correction operation.

Then, the first duty correction block 180 may control the duty ratio of the input clock signal CLKin according to the first control signal CS1 in the first duty correction operation, and the second duty correction block 190 may control the duty ratio of the output clock CLKout according to the second control signal CS2 in the second duty correction operation. The first control signal CS1 may include a plurality of bits for controlling the first duty correction block 180 and the second control signal CS2 may include a plurality of bits for controlling the second duty correction block 190. Otherwise, the first and second control signals CS1 and CS2 may change continuously.

The duty ratio of the input clock signal CLKin is corrected by a first loop that includes the first duty correction block 180, the delay line 110, the duty detector 172, and the duty controller 174. The duty ratio of the output clock CLKout is corrected by a second loop that includes the delay line 110, the second duty correction block 190, the duty detector 172, and the duty controller 174. As described above, the first loop and the second loop have different paths from each other, but the duty detector 172 and the duty controller 174 are commonly included in the first and second loops.

Figure 4:
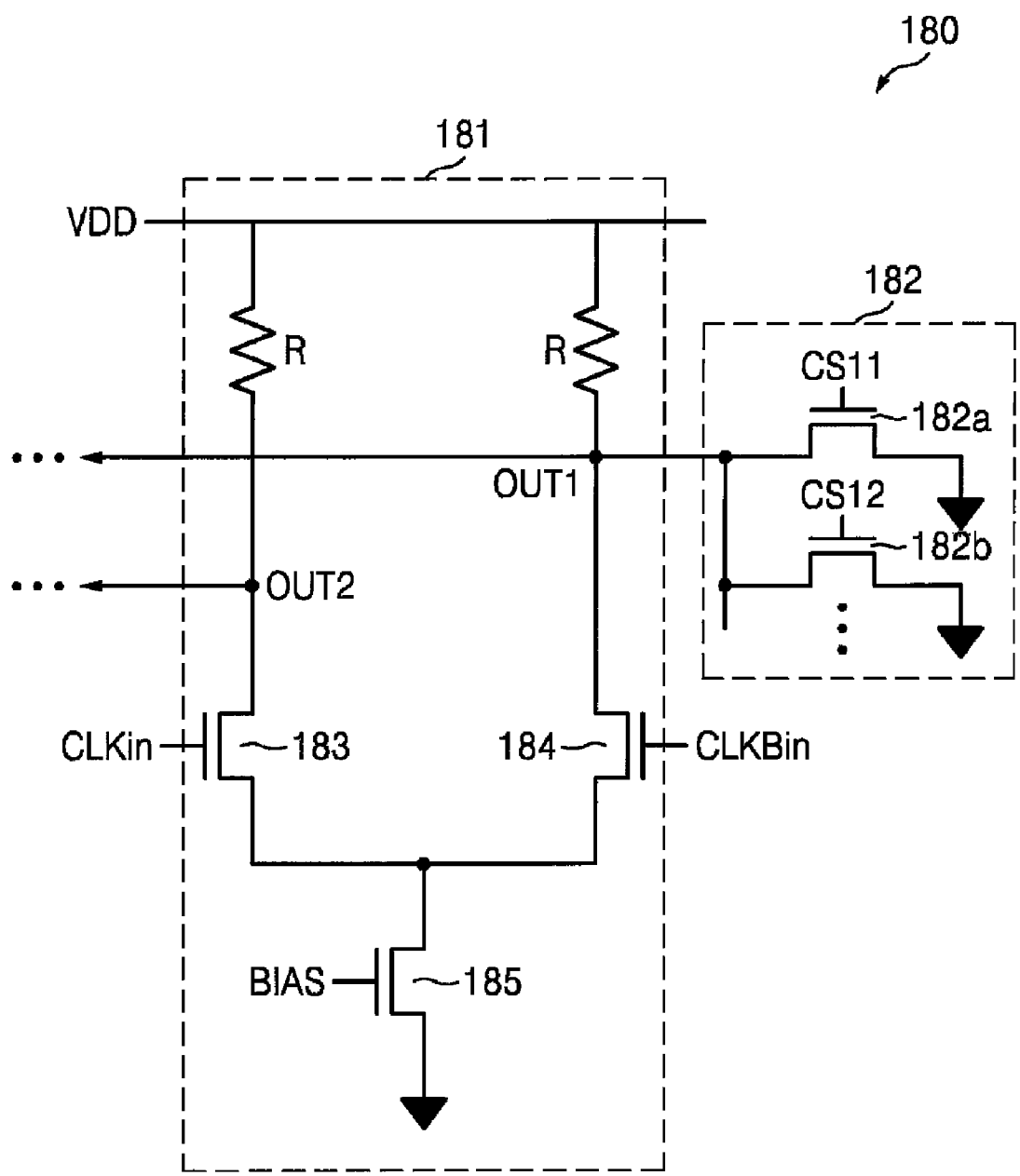
FIG. 4 is a circuit diagram of a first duty correction block included in the DLL circuit of FIG. 1, according to an embodiment of the inventive concepts.

FIG. 4 is a circuit diagram of the first duty correction block 180 included in the DLL 100 of FIG. 1, according to an embodiment of the inventive concepts. Referring to FIG. 4, the first duty correction block 180 includes a differential amplifier 181 and a duty control circuit 182. The differential amplifier 181 receives, amplifies, and outputs an input clock signal CLKin. The differential amplifier 181 includes a pair of differential transistors 183 and 184, a bias circuit 185, and a pair of load resistors R. More specifically, the differential amplifier 181 outputs a differential output signal obtained by amplifying the difference between the input clock signal CLKin and an inverted input clock signal CLKBin, via a pair of first and second output terminals OUT1 and OUT2.

The duty control circuit 182 may control the duty ratio of the input clock signal CLKin by controlling a common level of output signals of the differential amplifier 181 based on a first control signal CS1. The duty control circuit 182 may include at least one current path that may be formed between at least one output terminal, e.g., the first output terminal OUT1, from among the first and second output terminals OUT1 and OUT2 of the differential amplifier 181 and a first power supply voltage line, e.g., a ground voltage line, according to the first control signal CS1.

Referring to FIG. 4, the duty control circuit 182 may include a first switch 182a that is driven according to a first bit CS11 of the first control signal CS1, and a second switch 182b that is driven according to a second bit CS12 of the first control signal CS1. Although FIG. 4 illustrates only two switches 182a and 182b, the inventive concepts are not limited thereto.

The more switches that are short-circuited in the duty control circuit 182 according to the first control signal CS1, the more electric charges that are discharged from the first output terminal OUT1 to the ground voltage line, the lower the level of the differential output signal output via the first output terminal OUT1.

Thus, the common level of differential signals output via the first and second output terminals OUT1 and OUT2 is lowered. A differential output signal of the differential amplifier 181 is transformed into a single-ended signal in the first duty correction block 180. The duty ratio of the single-ended signal varies based on a change in the common level of the differential signals. Accordingly, the duty ratio of a clock signal output from the first duty correction block 180 may be controlled by controlling the common level of the differential signals output from the duty control circuit 182.

Referring to FIG. 4, the duty control circuit 182 is connected to only the first output terminal OUT1 but the inventive concept is not limited thereto. For example, the duty control circuit 182 may be connected to only the second output terminal OUT2 of the differential amplifier 181 or both the first and second output terminals OUT1 and OUT2 of the differential amplifier 181, according to the operating characteristics of the DLL 100.

If a current path is formed between the first output terminal OUT1 of the differential amplifier 181 and a power supply voltage line VDD, then the more switches that are short-circuited according to the first control signal CS1, the higher the level of the differential output signal output via the first output terminal OUT1. Then, the common level of the differential signals output via the first and second output terminals OUT1 and OUT2 is raised, thereby controlling the duty ratio of the clock signal output from the first duty correction block 180.

As described above, the duty control circuit 182 included in the first duty correction block 180 controls the duty ratio of the input clock signal CLKin according to the plurality of bits included in the first control signal CS1, but the inventive concepts are not limited thereto. For example, the first control signal CS1 may change continuously. In this case, the first duty correction block 180 may control the duty ratio of the input clock signal CLKin more precisely by controlling the common level of the differential signals according to the first control signal CS1 that changes continuously.

A method of correcting the duty ratio of the input clock signal CLKin by the first duty correction block 180 according to an embodiment of the inventive concepts has been described above with reference to FIG. 4. Although not shown, the second duty correction block 190 may include a differential amplifier and a duty control circuit, similar in the first duty correction block 180 of FIG. 4. However, the second duty correction block 190 is differentiated from the first duty correction block 180 in that a clock signal supplied to the differential amplifier is an output clock CLKout and the duty control circuit is controlled according to the second control signal CS2. The operation of the second duty correction block 190 is similar to that of the first duty correction block 180 described above with reference to FIG. 4 and thus will not be described here.

Figure 5:
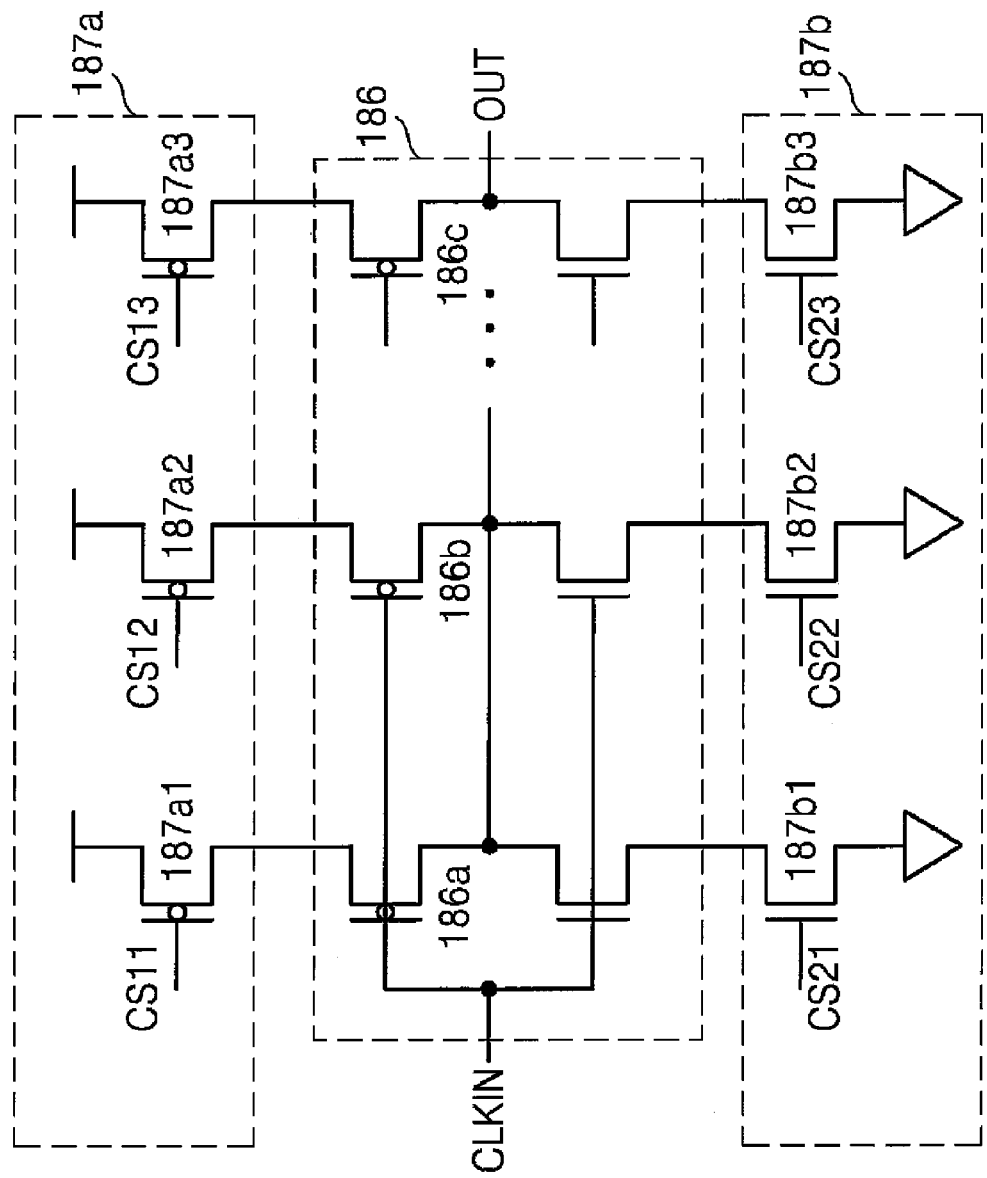
FIG. 5 is a circuit diagram of the first duty correction block included in the DLL circuit of FIG. 1, according to another embodiment of the inventive concepts.

FIG. 5 is a circuit diagram of a first duty correction block 180' that constitutes another embodiment of the first duty correction block 180 included in the DLL of FIG. 1, according to the inventive concepts. Referring to FIG. 5, the first duty correction block 180' includes at least one buffer unit 186 and first and second duty control circuits 187a and 187b. The at least one buffer unit 186 receives and buffers an input clock signal CLKin, but the inventive concepts are not limited thereto. For example, as illustrated in FIG. 5, in the first duty correction block 180', the at least one buffer unit 186 may include a plurality of buffers 186a, 186b, and 186c each buffering a clock signal received from a buffer adjacent thereto. The plurality of buffers 186a, 186b, and 186c may be embodied as inverters.

The first duty control circuit 187a may control the duty ratio of the input clock signal CLKin by controlling the inclination of a rising edge of the buffered input clock signal according to a first control signal containing first to third bits CS11, CS12, and CS13. The second duty control circuit 187b may control the duty ratio of the input clock signal CLKin by controlling the inclination of a falling edge of the buffered input clock signal according to a second control signal containing first to third bits CS21, CS22, and CS23.

If the first duty control circuit 187a changes the inclination of the rising edge of the buffered input clock signal, then the duty ratio of the buffered clock signal output from the at least one buffer unit 186 changes. A method of controlling the duty ratio of the input clock signal CLKin by the first duty control circuit 187a according to the first control signal will now be described in detail.

The first duty control circuit 187a includes a first switch 187a1 that is driven according to the first bit CS11 of the first control signal, a second switch 187a2 that is driven according to the second bit CS12 of the first control signal, and a third switch 187a3 that is driven according to the third bit CS13 of the first control signal.

The more switches that are short-circuited in the first duty control circuit 187a according to the first control signal, the higher the level of an output signal via an output terminal OUT of the first duty correction block 180', the greater the inclination of the rising edge of the buffered input clock signal, and the less the inclination of the falling edge of the buffered input clock signal. This is because as the number of switches that are short-circuited increases, the number of current paths formed between a power supply voltage line and the output terminal OUT increases. Accordingly, the duty ratio of the input clock signal CLKin may be controlled based on a change in the inclinations of edges of the buffered input clock signal.

If the second duty control circuit 187b changes the inclination of the falling edge of the input clock signal CLKin, then the duty ratio of the buffered clock signal output from the at least one buffer unit 186 changes. A method of controlling the duty ratio of the input clock signal CLKin by the second duty control circuit 187b according to the second control signal will now be described in detail.

The second duty control circuit 187b includes a first switch 187b1 that is driven according to the first bit CS21 of the second control signal, a second switch 187b2 that is driven according to the second bit CS22 of the second control signal, and a third switch 187b3 that is driven according to the third bit CS23 of the second control signal.

The more switches that are short-circuited in the second duty control circuit 187b according to the second control signal, the lower the level of the buffered input clock signal via the output terminal OUT of the first duty correction block 180', the falling edge of the buffered input clock signal, and the less the inclination of the rising edge of the buffered input clock signal. This is because as the number of switches that are short-circuited increases, the number of current paths formed between a ground voltage line and the output terminal OUT increases. Accordingly, the duty ratio of the input clock signal CLKin may be controlled based on a change in edges of the buffered input clock signal.

As described above, the first and second duty control circuits 187a and 187b included in the first duty correction block 180' control the duty ratio of the input clock signal CLKin according to the first control signal containing the first to third bits CS11, CS12, and CS13 and the second control signal containing the first to third bits CS21, CS22, and CS23, respectively, but the inventive concepts are not limited thereto. For example, the first control signal and the second control signal may change continuously. In this case, the first duty correction block 180' may control more precisely the duty ratio of the input clock signal CLKin by continuously controlling the rising or falling edge of the input clock signal CLKin according to the first and second control signals that change continuously.

In FIG. 5, the first duty correction block 180' includes the first duty control circuit 187a that controls the rising edge of the buffered input clock signal and the second duty control circuit 187b that controls the falling edge of the buffered input clock signal but the inventive concept is not limited thereto. For example, the first duty correction block 180' may include only one duty control circuit for controlling the rising or falling edge of the buffered input clock signal according to the operating characteristics of the DLL 100.

Figure 6:
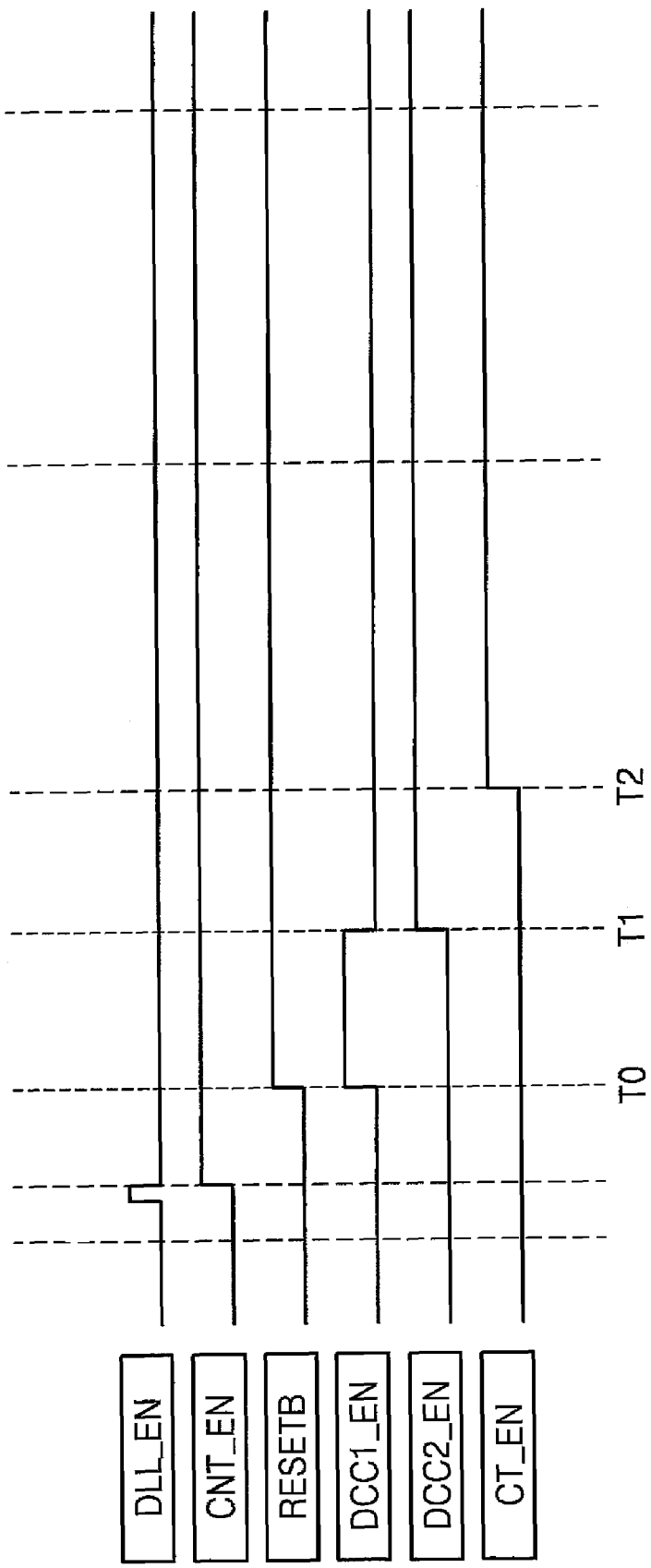
FIG. 6 is a timing diagram illustrating a duty correction method performed by a DLL circuit, according to an embodiment of the inventive concepts.

FIG. 6 is a timing diagram illustrating a duty correction method performed by the DLL 100 of FIG. 1 according to an embodiment of the inventive concepts. The duty correction method performed by the DLL will now be described in detail with reference to FIGS. 1 and 6.

The DLL begins to operate according to an enable signal DLL_EN. The DLL counts an input clock signal CLKin according to a count enable signal CNT_EN, and the result of the counting may be used as a reference value for determining sections in which the constitutional elements of the DLL 100 are to operate, respectively.

Before the DLL performs a first duty correction operation, the DLL is reset according to a reset signal RESETB. At a point of time T0 in which the resetting of the DLL is completed, the DLL corrects the duty ratio of the input clock signal CLKin according to a first duty correction enable signal DCC1_EN.

At a point of time T1 in which the correction of the duty ratio of the input clock signal CLKin is completed, the DLL corrects the duty ratio of an output clock CLKout according to a second duty correction enable signal DCC2_EN. Starting from a point of time T2, a predetermined time after the point of time T1 in which the correction of the duty ratio of the output clock CLKout starts, the DLL executes coarse locking according to a coarse locking enable signal CT_EN.

Figure 7:
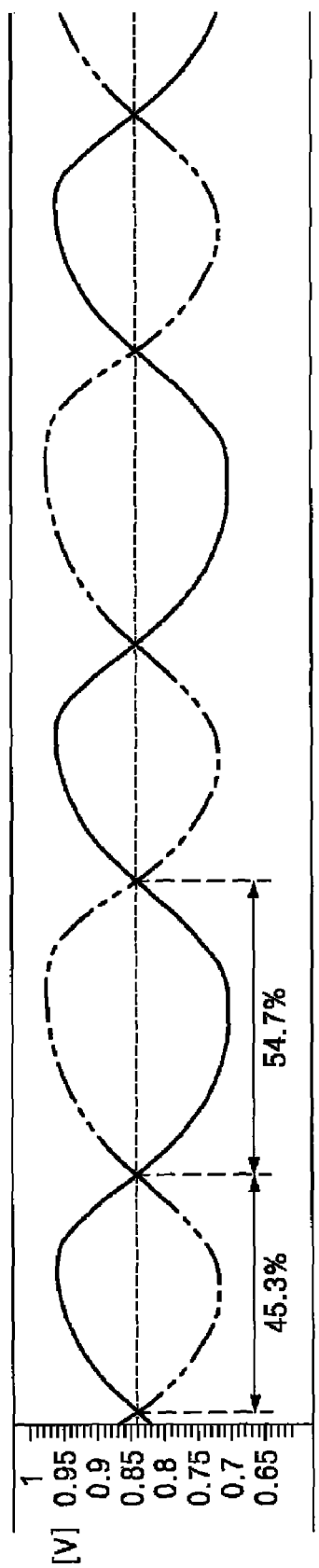
FIG. 7 is a graph illustrating a delayed clock signal output from a specific delay cell when a DLL circuit performs a duty correction method on an input clock signal, according to an embodiment of the inventive concepts.
Figure 8:
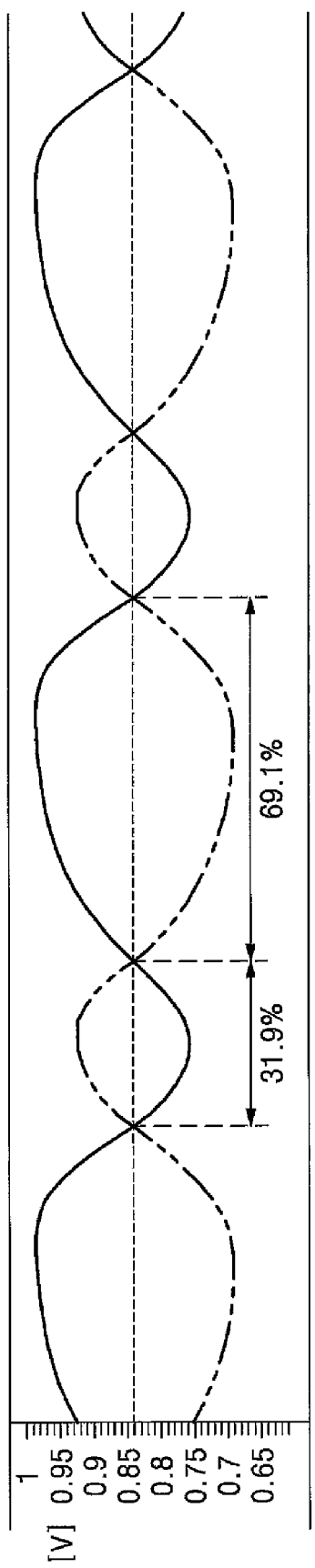
FIG. 8 is a graph illustrating a delayed clock signal output from a specific delay cell when a DLL circuit does not perform the duty correction method on an input clock signal, according to an embodiment of the inventive concepts.

FIG. 7 is a graph illustrating a delayed clock signal output from a specific delay cell when a DLL performs a duty correction method on an input clock signal CLKin, according to an embodiment of the inventive concepts. FIG. 8 is a graph illustrating a delayed clock signal output from a specific delay cell when a DLL does not perform the duty correction method on an input clock signal CLKin.

In FIGS. 7 and 8, the delayed clock signal output from the specific delay cell denotes a signal output from a specific delay cell related to an input clock signal CLKin having a duty ratio of 45:55. Referring to FIGS. 7 and 8, if the duty ratio of the input clock signal CLKin is corrected, then the duty ratio of the delayed clock signal output from the specific delay cell is 45.3:54.7, which is almost the same as the duty ratio of the input clock signal CLKin. However, if the duty ratio of the input clock signal CLKin is not corrected, then the duty ratio of the delayed clock signal output from the specific delay cell is 31.9:69.1, and thus, duty distortion is more serious than when the duty ratio of the input clock signal CLKin is corrected.

Although not shown, there may be a case where the DLL cannot perform coarse locking or fine locking when duty distortion becomes more serious in the input clock signal CLKin caused by a plurality of delay cells.

The DLL 100 and/or an electronic device (for example, a memory device) including the DLL 100 according to some embodiments of the inventive concepts may be packaged in any of various types of packages. Examples of such packages include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Figure 9:
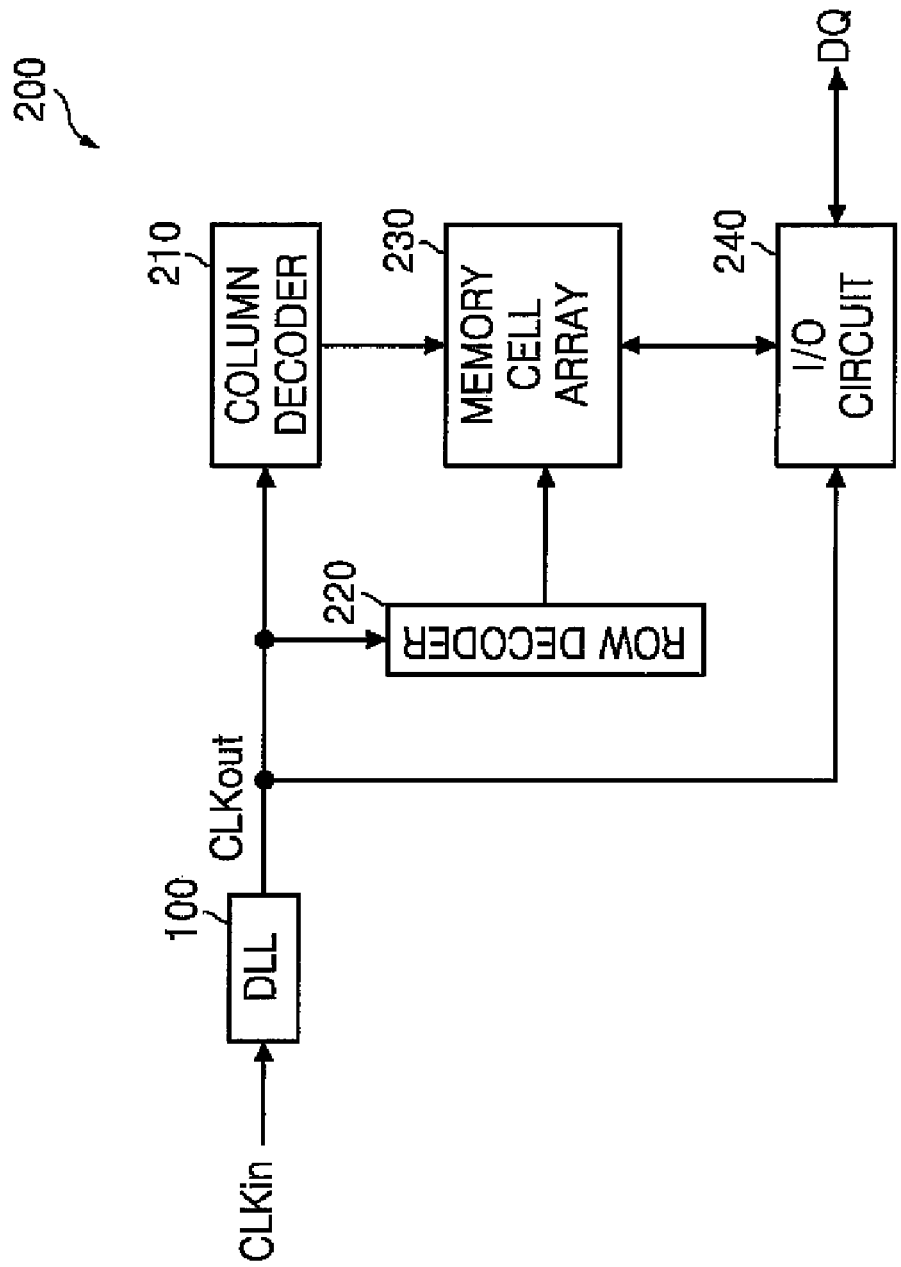
FIG. 9 is block diagram of a semiconductor memory device according to an embodiment of the inventive concepts

FIG. 9 is block diagram of a semiconductor memory device 200 according to an embodiment of the inventive concepts. The semiconductor memory device 200 includes the DLL 100, a column decoder 210, a row decoder 220, a memory cell 230, and an I/O circuit 240. FIG. 9 is provided to illustrate the utilization of the DLL 100 within the semiconductor memory device 200. Other elements such as a controller and a command decoder included in the semiconductor memory device 200 are not shown in FIG. 9. Since the DLL 100 has been described above with reference to FIGS. 1 through 8, detailed descriptions thereof will be omitted and the features of the semiconductor memory device 200 including the DLL 100 will be described.

An output clock signal CLKout of the DLL 100 may be a timing signal of the column decoder 210, the row decoder 220, and the I/O circuit 240. Therefore, the semiconductor memory device 200 may perform data receiving operation and data transmission based on the output signal CLKout of the DLL 100. The column decoder 210 and the row decoder 220 may access a plurality of memory cells included in the memory cell array 230. And the I/O circuit 240 may receive data DQ from a data bus and may transmit data DQ to the data bus.

The DLL 100 is used to generate a timing signal in the semiconductor memory device 200 in the embodiments illustrated in FIG. 9, but the use of the DLL 100 is not restricted to the current embodiments. It will be apparent to those of ordinary skill in the art that the delay locked loop 100 can be used in various types of electronic devices.

The inventive concepts, including the previously described "units" and/or "blocks" of the embodiments, can be embodied in hardware, software, firmware or combination thereof. When a method of the inventive concepts is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

As described above, according one or more embodiments of the inventive concepts, a delay-locked loop is capable of generating an output clock signal having a relatively precise duty ratio by correcting a duty ratio of the input clock before correcting a duty ratio of the output clock to substantially eliminate duty ratio distortion which may be accumulated according to delay of the input clock.

While the inventive concept has been particularly shown and described with reference to exemplary embodiments thereof, it will be understood that various changes in form and details may be made therein without departing from the spirit and scope of the following claims.

What is claimed is:

1. A delay-locked loop circuit comprising:
   a delay line comprising a cascade of delay cells, the delay line for receiving an input clock signal and the delay cells for respectively generating a plurality of delayed input clock signals based on the input clock signal; and
   a duty correction block for executing a first duty correction operation and a second duty correction operation, wherein the first duty correction operation includes correcting a duty ratio of the input clock signal based on a duty ratio of at least one clock signal from among the input clock signal and the plurality of delayed input clock signals, and wherein the second duty correction operation includes correcting a duty ratio of an output clock signal based on the duty ratio of the output clock signal.

2. The delay-locked loop of claim 1, wherein the duty correction block comprises:
   a duty detector for detecting the duty ratio of the at the least one clock signal from among the input clock signal and the plurality of delayed input clock signals in the first duty correction operation, and detecting the duty ratio of the output clock signal in the second duty correction operation;

a duty controller for generating a first control signal based on the detected duty ratio of the at least one clock signal in the first duty correction operation, and generating a second control signal based on the detected duty ratio of the output clock signal in the second duty correction operation;

a first duty correction block for controlling the duty ratio of the input clock signal according to the first control signal in the first duty correction operation; and a second duty correction block for controlling the duty ratio of the output clock signal according to the second control signal in the second duty correction operation.

3. The delay-locked loop of claim 2, wherein the first duty correction block comprises:

a first differential amplifier for receiving, amplifying, and outputting the input clock signal; and a first duty control circuit for controlling the duty ratio of the input clock signal by controlling a common level of signals output from the first differential amplifier, based on the first control signal.

4. The delay-locked loop of claim 2, wherein the second duty correction block comprises:

a second differential amplifier for receiving, amplifying, and outputting the output clock; and a second duty control circuit for controlling the duty ratio of the output clock signal by controlling a common level of signals output from the second differential amplifier, based on the second control signal.

5. The delay-locked loop of claim 2, wherein the first duty correction block comprises:

at least one first buffer for receiving and buffering the input clock signal; and a first duty control circuit for controlling the duty ratio of the input clock signal by controlling an inclination of a rising or falling edge of the buffered input clock signal according to the first control signal.

6. The delay-locked loop of claim 2, wherein the second duty correction block comprises:

at least one second buffer for receiving and buffering the output clock; and a second duty control circuit for controlling the duty ratio of the output clock signal by controlling an inclination of a rising or falling edge of the buffered output clock signal according to the second control signal.

7. A delay-locked loop comprising:

a delay line comprising a cascade of delay cells, the delay line for receiving an input clock signal and the delay cells for respectively generating a plurality of delayed input clock signals based on the input clock signal; and a first duty correction block for correcting a duty ratio of the input clock signal according to a first control signal;

a second duty correction block for correcting a duty ratio of an output clock signal according to a second control signal; and a duty control block for generating the first control signal based on a duty ratio of at least one clock signal from among the input clock signal and the plurality of delayed input clock signals in a first duty correction operation in which the duty ratio of the input clock signal is corrected, and generating the second control signal based on the duty ratio of the output clock signal in a second duty correction operation in which the duty ratio of the output clock signal is corrected.

8. The delay-locked loop of claim 7, wherein the duty control block comprises:

a duty detector for detecting the duty ratio of the at least one clock signal from among the input clock signal and the plurality of delayed input clock signals in the first duty correction operation, and detecting the duty ratio of the output clock signal in the second duty correction operation; and a duty controller for generating the first clock signal based on the detected duty ratio of the at least one clock signal in the first duty correction operation, and generating the second control signal based on the duty ratio of the output clock signal in the second duty correction operation.

9. The delay-locked loop of claim 8, wherein the first duty correction block comprises:

a first differential amplifier for receiving, amplifying, and outputting the input clock signal; and a first duty control circuit for controlling the duty ratio of the input clock signal by controlling a common level of signals output from the first differential amplifier based on the first control signal, and wherein the second duty correction block comprises:

a second differential amplifier for receiving, amplifying, and outputting the output clock signal; and a second duty control circuit for controlling the duty ratio of the output clock signal by controlling a common level of signals output from the second differential amplifier based on the second control signal.

10. The delay-locked loop of claim 8, wherein the first duty correction block comprises:

at least one first buffer for receiving, amplifying, and buffering the input clock signal; and a first duty control circuit for controlling the duty ratio of the input clock signal by controlling an inclination of a rising or falling edge of the buffered input clock signal according to the first control signal, and wherein the second duty correction block comprises:

at least one second buffer for receiving, amplifying, and buffering the output clock signal; and a second duty control circuit for controlling the duty ratio of the output clock signal by controlling an inclination of a rising or falling edge of the buffered output clock signal according to the second control signal.

11. A electronic device using an output clock signal of a delay-locked loop by a timing signal, and wherein the delay-locked loop comprises:

a delay line comprising a cascade of delay cells, the delay line for receiving an input clock signal and the delay cells for respectively generating a plurality of delayed input clock signals based on the input clock signal; and a duty correction block for executing a first duty correction operation and a second duty correction operation, wherein the first duty correction operation includes correcting a duty ratio of the input clock signal based on a duty ratio of at least one clock signal from among the input clock signal and the plurality of delayed input clock signals, and wherein the second duty correction operation includes correcting a duty ratio of the output clock signal based on the duty ratio of the output clock signal.

12. The electronic device of claim 11, wherein the duty correction block comprises:

a duty detector for detecting the duty ratio of the at the least one clock signal from among the input clock signal and the plurality of delayed input clock signals in the first duty correction operation, and detecting the duty ratio of the output clock signal in the second duty correction operation;

a duty controller for generating a first control signal based on the detected duty ratio of the at least one clock signal in the first duty correction operation, and generating a second control signal based on the detected duty ratio of the output clock signal in the second duty correction operation;

a first duty correction block for controlling the duty ratio of the input clock signal according to the first control signal in the first duty correction operation; and a second duty correction block for controlling the duty ratio of the output clock signal according to the second control signal in the second duty correction operation.

13. The of electronic device claim 12, wherein the first duty correction block comprises:

a first differential amplifier for receiving, amplifying, and outputting the input clock signal; and a first duty control circuit for controlling the duty ratio of the input clock signal by controlling a common level of signals output from the first differential amplifier, based on the first control signal.

14. The electronic device of claim 2, wherein the second duty correction block comprises:

a second differential amplifier for receiving, amplifying, and outputting the output clock; and a second duty control circuit for controlling the duty ratio of the output clock signal by controlling a common level of signals output from the second differential amplifier, based on the second control signal.

15. The electronic device of claim 12, wherein the first duty correction block comprises:

at least one first buffer for receiving and buffering the input clock signal; and a first duty control circuit for controlling the duty ratio of the input clock signal by controlling an inclination of a rising or falling edge of the buffered input clock signal according to the first control signal.

16. The electronic device of claim 12, wherein the second duty correction block comprises:

at least one second buffer for receiving and buffering the output clock; and a second duty control circuit for controlling the duty ratio of the output clock signal by controlling an inclination of a rising or falling edge of the buffered output clock signal according to the second control signal.

* * * * *